(12) United States Patent
Shimooka et al.

(10) Patent No.: US 7,524,758 B2
(45) Date of Patent: Apr. 28, 2009

(54) INTERCONNECT STRUCTURE AND METHOD FOR SEMICONDUCTOR DEVICE

(75) Inventors: Yoshiaki Shimooka, Danbury, CT (US); Tadashi Iijima, Yorktown Heights, NY (US)

(73) Assignee: Toshiba America Electronic Components, Inc., Irvine, CA (US)

( * ) Notice: Subject to any disclaimer, the term of this patent is extended or adjusted under 35 U.S.C. 154(b) by 357 days.

(21) Appl. No.: 11/356,146

(22) Filed: Feb. 17, 2006

(65) Prior Publication Data

US 2007/0197024 A1     Aug. 23, 2007

(51) Int. Cl.
*H01L 21/4763* (2006.01)

(52) U.S. Cl. ............... 438/637; 438/672; 257/E21.575; 257/E21.577

(58) Field of Classification Search ................. 438/637, 438/643, 645, 689, 629, 633, 647, 672, 674, 438/675; 257/E21.575, E21.577
See application file for complete search history.

(56) References Cited

U.S. PATENT DOCUMENTS

| 5,863,828 | A | * | 1/1999 | Snyder | 438/437 |
| 6,358,830 | B1 | | 3/2002 | Morozumi | |
| 7,104,869 | B2 | * | 9/2006 | Tsai et al. | 451/41 |
| 7,179,717 | B2 | * | 2/2007 | Sandhu et al. | 438/424 |

* cited by examiner

*Primary Examiner*—Quoc D Hoang
(74) *Attorney, Agent, or Firm*—Banner & Witcoff, Ltd.

(57) ABSTRACT

An interconnect method in a semiconductor device may include a step of examining various regions of an inter layer dielectric to identify regions having high densities or concentrations of trench features. A cap insulator layer may be added to the dielectric to assist in outgassing of absorbed impurities from the dielectric, but may be removed from the high density areas to allow the lower density areas to increase outgassing. The lower density areas may then compensate for increased outgassing on the high density areas due to the trench features, and may result in an overall device with a more stable dielectric constant across the device.

17 Claims, 6 Drawing Sheets

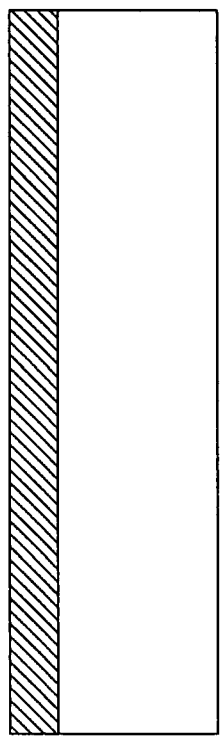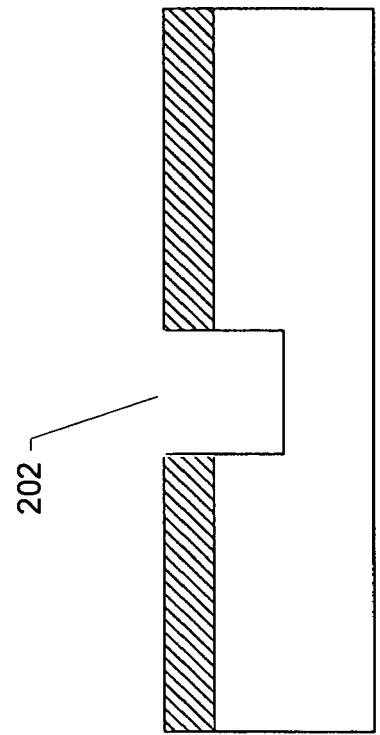
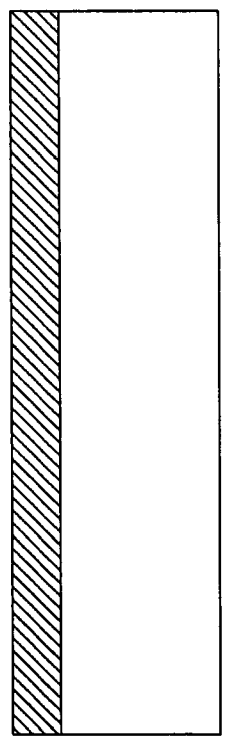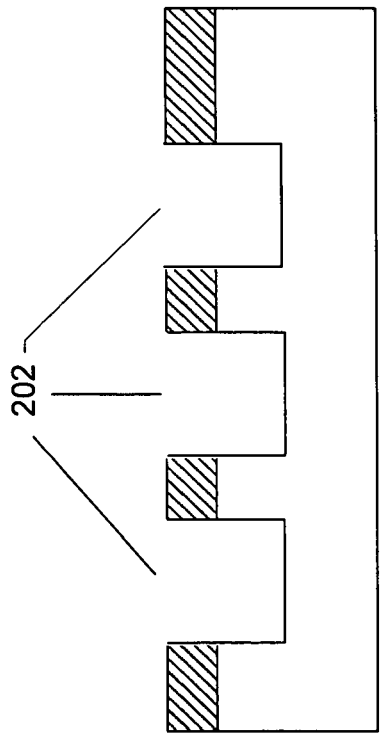
Fig. 3a
Fig. 3b

INTERCONNECT STRUCTURE AND METHOD FOR SEMICONDUCTOR DEVICE

BACKGROUND

Semiconductor manufacturing processes operate on a very small scale, where the tiniest amount of impurity in a semiconductor wafer can render the device inoperable. For this reason, there is a need for improved manufacturing methods that can help reduce the appearance and effects of impurities. Some such methods involve highly-filtered clean rooms, to help ensure that unwanted particulates are removed from the interior environment. While such filtering systems are beneficial, they are far from perfect, and there remain various types of impurities that can still exist in the filtered clean room. When such impurities remain in the clean room, they may unfortunately be absorbed by the semiconductor wafers and devices during the manufacturing process, leading to undesired results.

FIG. 1 illustrates a basic example of a semiconductor device during a manufacturing process that may experience such undesired results. In the process, circuit components are formed on a substrate, such as an interlayer (or interlevel) dielectric (ILD) 100. Components are formed by creating trenches 101 in the ILD 100, where the trenches are filled with different conductive/insulating/semiconductive materials to form interconnections, transistor elements, etc. of a semiconductor circuit. When the ILD 100 is manufactured in an environment having impurities, such as water moisture and ammonia particles, those impurities may be absorbed by the ILD 100. The absorption of such particles into the ILD 100 may have the undesired effect of lowering the dielectric constant (k) of the device(s) created on the ILD 100.

Manufacturing processes may include some steps, such as annealing, that may allow the ILD 100 to outgas some of the absorbed impurities. However, this outgassing might not occur uniformly. For example, ILD 100 may include some portions 102 that are relatively densely populated with trenches, while other portions 103 are more isolated, and not as densely populated. These portions experience different amounts of outgassing. In the denser portion 102, more outgassing can occur because of the larger surface area of the ILD 100 exposed by the trenches (e.g., the side walls of the trenches that extend into the ILD 100, and create additional surface area). In the less dense portion 103, less outgassing can occur because there is a smaller exposed surface area due to there being fewer trenches.

This imbalance in outgassing can lead to a variation in the ILD 100's dielectric constant (k) across portions of the device. Such variation can make it more difficult to reliably design and construct semiconductor devices, and it would be an advance in the art if this imbalance could be reduced and/or minimized.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In some aspects, a semiconductor device manufacturing method may include steps of depositing a cap insulator layer on an inter layer dielectric, forming trenches in the dielectric, and identifying high and low density regions based on a concentration of trenches in the regions. Regions having higher densities of trenches, or trench densities that exceed a predetermined cutoff value, may have their cap insulator layers removed, so that the cap insulator layers remain only on the low density regions.

Interconnect material, such as barrier layers and/or seed metals, may be deposited in the trenches to form interconnects on the resulting device. In some aspects, and depending on the metals involved, a damascene process may be used for the deposition.

In some aspects, the removal may be performed after the interconnect material is deposited. This removal may be performed using chemical mechanical polishing, and by adjusting polishing rates over different regions of the inter layer dielectric. In other aspects, the removal may be performed before interconnect material is added to the trenches, such as by a photoresist etching process. A subsequent chemical mechanical polishing to remove unwanted interconnect material may be performed without having to adjust different polishing rates over different regions of the dielectric.

To determine whether a region has a high or low trench density, the surface area of a region may be compared with the surface area occupied by trenches in the region, and a resulting percentage may be compared against a predetermined cutoff value defining high and/or low density regions.

These and other features will be described in greater detail below.

BRIEF DESCRIPTION OF THE DRAWINGS

FIGS. 3a-e illustrate steps in an alternative semiconductor manufacturing process.

DETAILED DESCRIPTION

Figure 1:
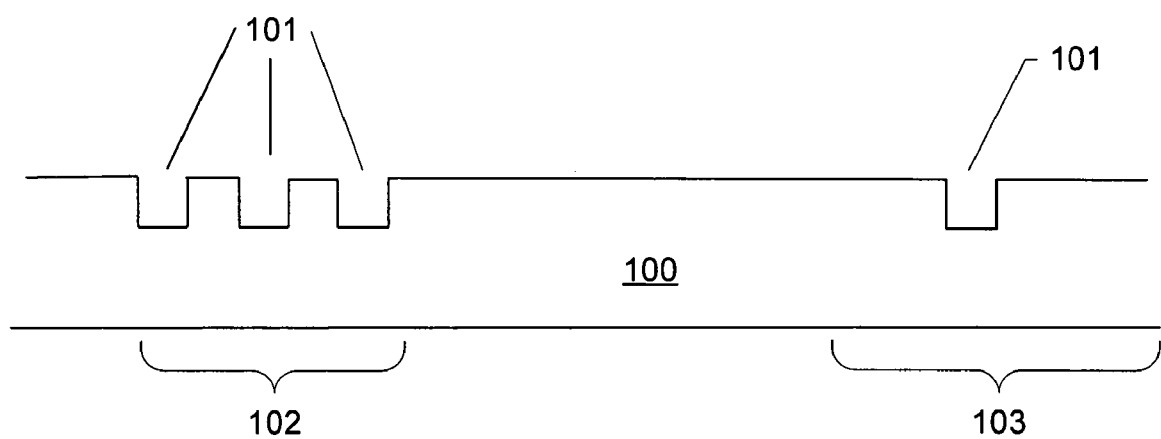
FIG. 1 illustrates a basic example of a semiconductor manufacturing process.
Figure 2A:
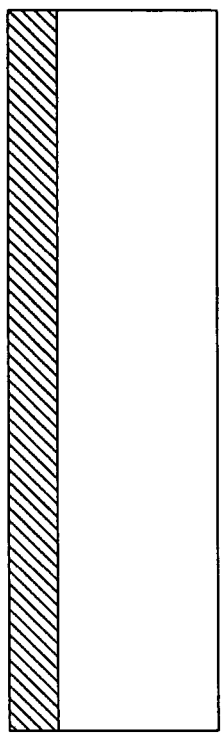
FIGS. 2a-d illustrate steps in a semiconductor manufacturing process.
Figure 2A:
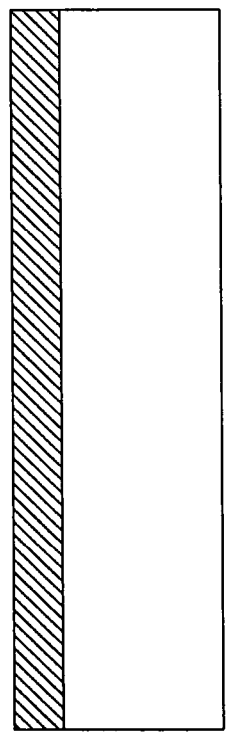
Figure 2B:
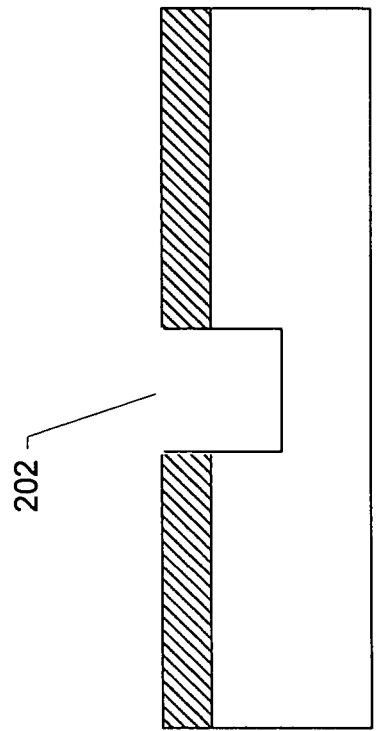
Figure 2B:
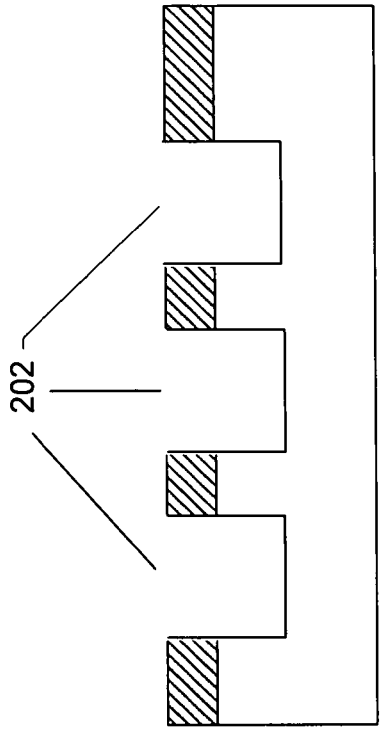
Figure 2C:
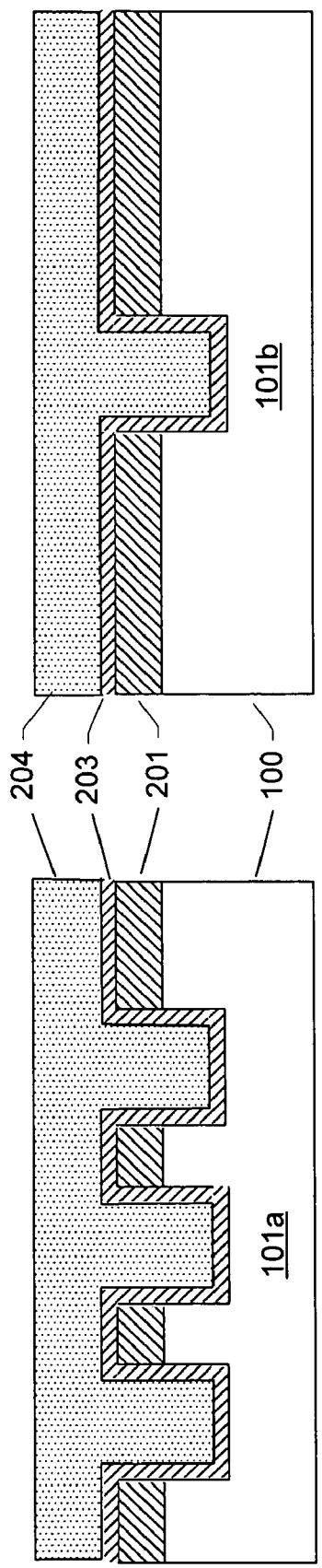

FIG. 2a illustrates an example ILD 100, which can be of any dielectric substance(s), such as silicon oxycarbide (Si-COH), CxHy, etc. The figure illustrates two portions of a semiconductor device, where a portion shown on the left will have a higher density of trenches than the portion shown on the right. A cap insulator 201 may be deposited on the ILD 100 using any desired deposition technique (e.g, vapor deposition, sputtering, etc.). The cap insulator 201 may be of any desired substance that can absorb undesired impurities. For example, tetraethoxysilane (TEOS) or silicon oxycarbide (Si-COH) can be used as the cap insulator 201 substance.

When the cap insulator 201 has been deposited, various trenches 202 may then be formed on the ILD 100 as needed to create the various circuit components, such as line interconnects. The trenches may be formed using any desired process, such as photoresist etching and/or other lithography. The trenches may then be lined 203 with a barrier material (such as a metal, like titanium nitride (TiN), tantalum nitride (TaN), titanium (Ti) and tantalum (Ta)), and a metal or other conductive material 204, such as copper (Cu), aluminum (Al), or silver (Ag), which may be deposited using any desired technique, such as by first applying a seed layer of the conductive material 204.

The ILD 100 design may be examined to identify portions of the ILD 100's surface that have a higher concentration of trenches, and portions of the ILD 100's surface that have a lower concentration of trenches. This may be done in a variety of ways. For example, the following calculation may be performed to calculate a percentage identifying the amount of trench surface area occupying a given portion of the ILD 100:

$$S_{RATIO} = \frac{S_{TRENCH}}{S_{PORTION}}$$

In this example, $S_{PORTION}$ refers to the original (e.g., before trenches were formed) surface area of a portion of the ILD 100 being examined, $S_{TRENCH}$ refers to the surface area of the ILD 100 occupied by trench structures in the portion of the ILD 100 under consideration, and $S_{RATIO}$ refers to a percentage of the portion's surface area that is occupied by trench structures. The portion referred to above can be defined in any way, such as dividing the surface of the ILD 100 into a grid (e.g., 1 square micrometer, 100 square micrometers, etc.) of portions, each having its own $S_{RATIO}$.

The $S_{RATIO}$ for a particular portion may then be compared with a predetermined cutoff value for high- and/or low-density portions. For example, a high density cutoff value of 50% may be defined, meaning those portions whose ratios are equal to or greater than 50% are considered high density. Additionally or alternatively, a low-density cutoff value of 30% may be defined, so that portions whose ratios are less than 30% are considered low density. Other values may be used for either of these ratios, depending on designer's choice (e.g., high-density cutoff values of 40%, 60%, etc. and low-density cutoff values of 20%, 25%, etc.).

Variations to the above can also be made to accomplish the same result. For example, the calculated ratio can identify the remaining exposed ILD 100 surface area after trench formation, as opposed to the amount of occupied surface area. The calculations can also take into account the depths of the trenches, such as by adding in the side wall surface area after calculating an amount of remaining original surface area of ILD 100.

Figure 2D:
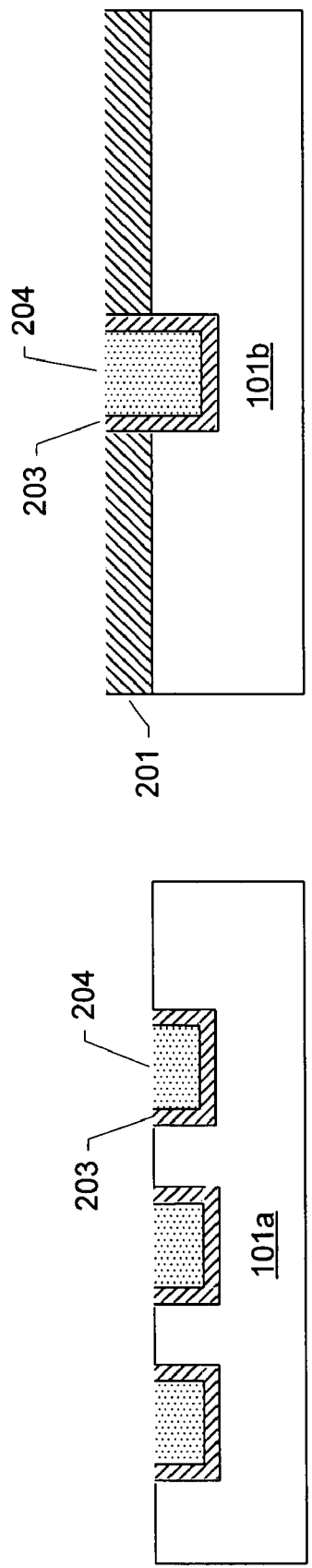

Using one or more of these calculations, certain portions of the ILD 100 may be designated as high density portions 101*a*, and other portions are designated as low density portions 101*b*. When the high density 101*a* and low density 101*b* portions have been identified, they may be treated differently in the manufacturing process. As shown in FIG. 2*d*, chemical mechanical polishing (CMP) may be applied to remove unwanted portions of the barrier metal liner 203 and conductive material 204. This polishing may be controlled to be different for various portions of the semiconductor device so that different amounts of cap insulator 201 are removed, depending on whether a portion is a high or low density portion. In the FIG. 2*d* example, cap insulator layer 201 is completely removed from high density region 101*a*, but the layer 201 remains, or is preserved, in the low density region 101*b*. This CMP can be controlled in a number of ways. For example, polishing rates for the two regions may be adjusted with respect to one another by adjusting the slurry type used for each region, or the down force used in each region.

The cap insulator layer 201 material absorbs certain impurities from the ILD 100, such as the water and ammonia particles mentioned above. Accordingly, impurities that were previously absorbed into the ILD 100 at the low density region 101*b* may be pulled out of the low density region 101*b* by the remaining cap insulator layer 201. The cap insulator layer 201 may also help prevent the absorption of additional impurities into the ILD 100 from sources external to the semiconductor device. By having this cap insulator layer 201 at the low density region 101*b*, but not in the high density region 101*a*, the low density region 101*b* will be able to outgas additional impurities to compensate for the increased outgassing that the high density region 101*a* experienced. As a result, a more uniform distribution of impurities may be achieved in the ILD 100 between areas of different densities, reducing the variation in dielectric constant (k) among different portions of the device.

Figure 3C:
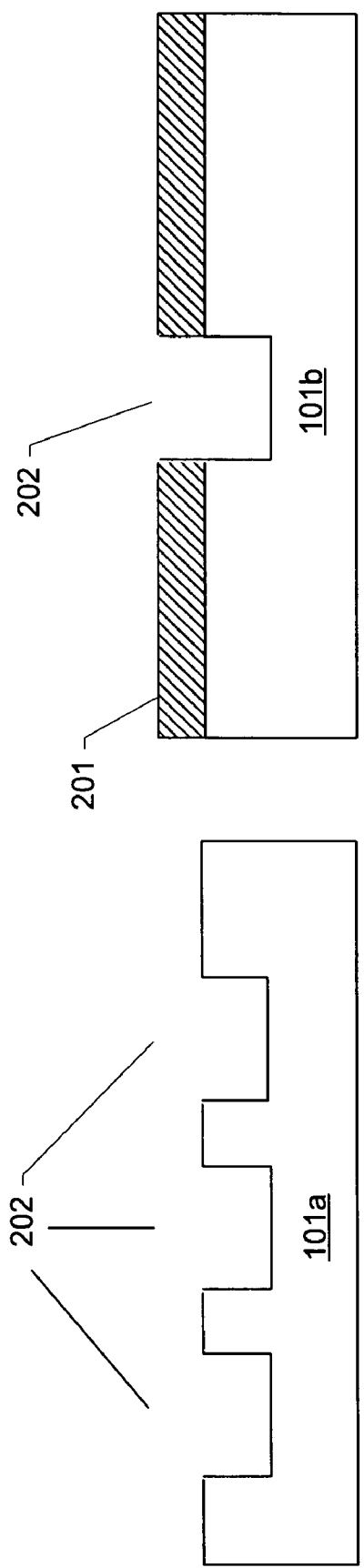
Figure 3D:
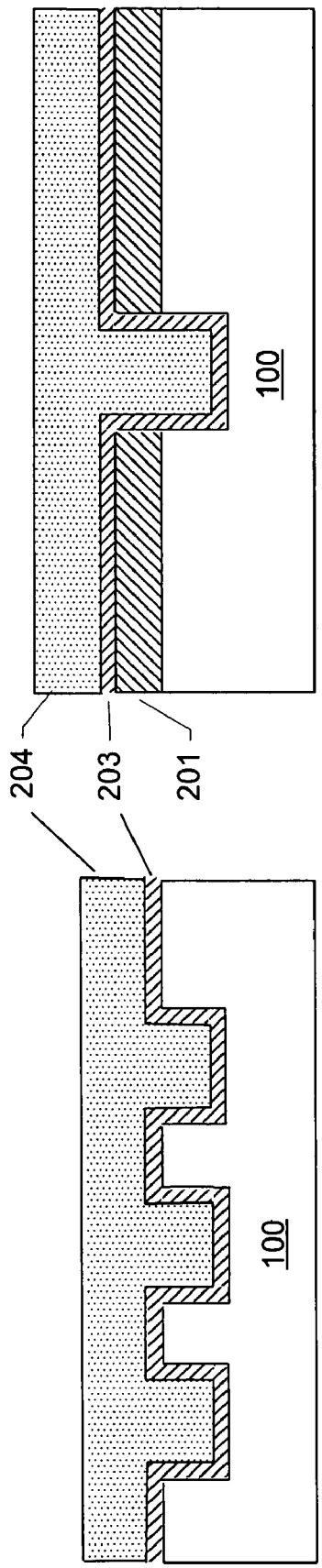
Figure 3E:
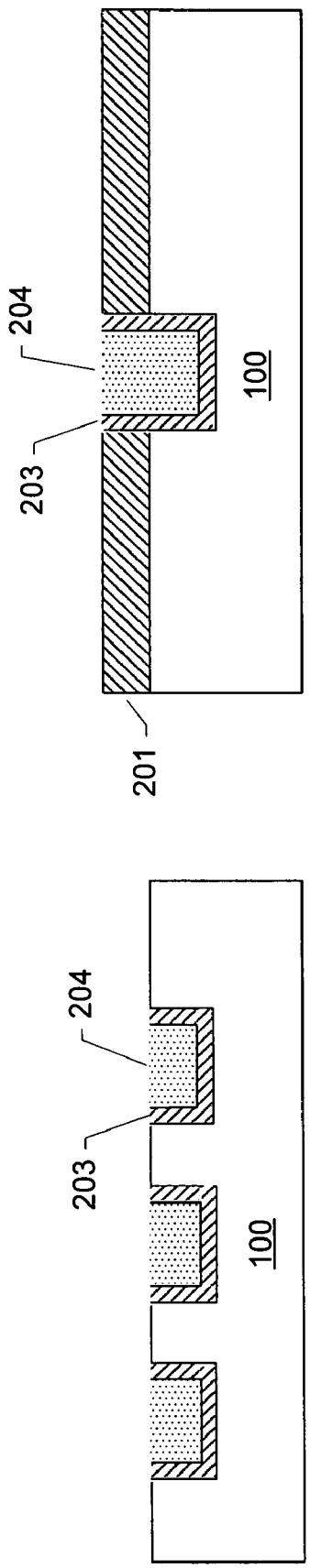

FIGS. 3*a*-*e* illustrate many of the same process steps shown in FIGS. 2*a*-2*d*, but with some variation. FIGS. 3*a* and 3*b* are the same as FIGS. 2*a* and 2*b*, although after the trenches 202 are formed in FIG. 3*b*, a step of etching may be performed to remove the cap insulator layer 201 from areas of the ILD 100 that are designated as high density. This etching may be accomplished, for example, by using masking and photoresist techniques to remove the appropriate portion of the cap insulator layer 201. As shown in FIG. 3*c*, the cap insulator layer 201 is completely removed from the surface of the ILD 100 at the high density area 101*a*, but remains on the surface at the low density area 101*b*. Then, as shown in FIGS. 3*d* and 3*e*, the liner 203 and conductive material (e.g., metal) 204 may be deposited and polished down using CMP, as described above with respect to FIGS. 2*c* and 2*d*, respectively. In this example, the amount of CMP used in the process between FIGS. 3*d* and 3*e* may be the same as between the high and low density regions, avoiding the need for adjusting different polishing rates in the different regions.

Other variations to these methods are also possible, as the techniques and structures described thus far are merely examples of the various features described herein. For example, the step of determining which portions are high and low density need not occur at the specific steps described above, and can instead occur at any time during the manufacturing process (e.g., at the initial design stage, during manufacture but before trenches are formed, etc.). Additionally, although the examples described above refer to particular types of deposition and/or removal processes, and particular examples of materials, these are merely examples, and the present application is not limited to those specific examples. As another example, the initial cap insulator layer 201 need not be deposited onto the high density portion 101*a* at all, and instead the layer 201 may be selectively deposited onto just the low density portion 101*b*.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

We claim the following:

1. A semiconductor device manufacturing method, comprising the steps of:
   depositing a cap insulator layer on an inter layer dielectric;
   forming a plurality of trenches in first and second regions of said inter layer dielectric and said cap insulator layer, the first region having a greater trench density than the second region; and
   removing said cap insulator layer over said first region, so that said cap insulator layer remains over said second region, based on a comparison of trench concentrations in said regions.

2. The method of claim 1, wherein said step of removing further comprises the step of adjusting a chemical mechanical polishing rate between said first and second regions.

3. The method of claim 1, further comprising a step of depositing conductive material in said trenches in said first and second regions.

4. The method of claim 3, wherein said step of depositing conductive material is performed after said step of removing, and said step of removing is performed using photoresist etching.

5. The method of claim 3, wherein said step of depositing conductive material is performed before said step of removing, and said step of removing is performed using chemical mechanical polishing.

6. The method of claim 5, wherein said step of removing further comprises a step of using different polishing rates of said chemical mechanical polishing in said first and second regions.

7. The method of claim 3, wherein said step of depositing interconnect material includes the steps of:
  depositing a barrier material layer in said trenches; and
  depositing a seed metal layer on said barrier material in said trenches.

8. The method of claim 3, wherein said step of depositing interconnect material uses a damascene process.

9. The method of claim 1, wherein said cap insulator layer is SiCOH.

10. The method of claim 1, further including the steps of:
  calculating a trench density in said first region; and
  comparing said trench density with a predetermined density cutoff value.

11. The method of claim 10, wherein said trench density is a percentage of an area of said first region occupied by trenches, and said predetermined cutoff value is a percentage.

12. The method of claim 1, further comprising a step of identifying said second region as a low density region based on said region having a trench density value below a predetermined low density region cutoff value.

13. A semiconductor device manufacturing method, comprising the steps of:
  depositing a cap insulator layer on an inter layer dielectric;
  forming a plurality of trenches in said inter layer dielectric and said cap insulator layer;
  calculating trench densities for a plurality of regions of said inter layer dielectric; and
  selectively removing portions of said cap insulator layer based on said trench densities, wherein said cap insulator layer is removed from at least one of the regions of said inter layer dielectric having a first trench density, and preserved on at least another of the regions of said inter layer dielectric having a second trench density smaller than the first trench density.

14. The method of claim 13, wherein said step of selectively removing includes the step of comparing said calculated trench densities with a predetermined density cutoff value.

15. The method of claim 13, wherein said calculated trench densities are a percentage of surface area of said inter layer dielectric occupied by said trenches.

16. The method of claim 13, further comprising a step of forming conductive material in the trenches before said step of selectively removing, and performing said step of selectively removing using chemical mechanical polishing.

17. The method of claim 13, further comprising a step of forming conductive material in the trenches after said step of selectively removing, and performing said step of selectively removing using photoresist etching.

* * * * *